(12) United States Patent
Bertrand et al.

(10) Patent No.: US 6,487,221 B1
(45) Date of Patent: Nov. 26, 2002

(54) DIGITAL DEVICE AND METHOD FOR FILTERING, DECIMATION AND TRANSPOSITION INTO DISTRIBUTED BASEBAND AND CORRESPONDING DIGITAL MODULATOR

(75) Inventors: Cyril Bertrand, Paris (FR); Philippe Sehier, St Germain en Laye (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/155,714

(22) PCT Filed: Feb. 9, 1998

(86) PCT No.: PCT/FR98/00242

§ 371 (c)(1),
(2), (4) Date: Oct. 5, 1998

(87) PCT Pub. No.: WO98/35464

PCT Pub. Date: Aug. 13, 1998

(30) Foreign Application Priority Data

Feb. 10, 1997 (FR) .............................. 97 01477

(51) Int. Cl.$^7$ ................................. H04J 1/02
(52) U.S. Cl. ...................... 370/497; 370/480
(58) Field of Search ............... 370/497, 204, 370/206, 480, 488, 498, 532, 533, 536, 542, 543, 278, 281, 282, 295, 319, 329, 332, 330, 344, 437; 375/350, 355, 343, 324

(56) References Cited

U.S. PATENT DOCUMENTS

| 4,424,492 | A |   | 1/1984 | Potter | 327/114 |
| 4,896,320 | A | * | 1/1990 | Gockler | 370/497 |
| 5,247,515 | A |   | 9/1993 | White | 370/484 |
| 5,621,345 | A | * | 4/1997 | Lee et al. | 327/254 |
| 5,933,467 | A | * | 8/1999 | Sehier et al. | 375/350 |
| 6,335,954 | B1 | * | 1/2002 | Bottomley et al. | 375/354 |

FOREIGN PATENT DOCUMENTS

| EP | 0 365 785 A2 | 5/1990 |
| EP | 0 367 932 A2 | 5/1990 |
| EP | 0 632 577 A1 | 1/1995 |
| EP | 0 651 526 A3 | 5/1995 |

OTHER PUBLICATIONS

E. Auer et al "Design and Performance of a VLSI Implemented 16 Channel FDM Demultiplexer for Onboard Processing", 3$^{rd}$ European Conference On Satellite Communications, Manchester, Nov. 2–4, 1993, Institution Of Electrical Engineers, New York, US, pp. 211–215.

* cited by examiner

Primary Examiner—Douglas Olms
Assistant Examiner—Phirin Sam
(74) Attorney, Agent, or Firm—Sughrue Mion, PLLC

(57) ABSTRACT

The invention relates to apparatus for filtering, decimating and transposing into baseband, the apparatus being of the entirely digital type, and serving both to extract and transpose into baseband one of the channels, referred to as the "channel of interest", of a frequency multiplex of channels, and also to reduce the oversampling factor of said channel of interest, each channel being associated with a distinct carrier. The said apparatus comprising at least two stages in cascade ($40_1$ to $40_L$), each stage comprising filter means (42) and decimation means (43), said filter means being placed upstream from said decimation means and enabling a portion of the spectrum to be purged at locations where the decimation means produce aliasing. According to the invention, each stage ($40_1$ to $40_L$) also comprises transposition means (41) placed upstream from said filter means (42) and associated with a transposition frequency ($f_{t,i}$) previously selected from a set of N possible distinct transposition frequencies so as to transpose the carrier ($p_0$) associated with said channel of interest as close as possible to zero frequency.

15 Claims, 3 Drawing Sheets

DIGITAL DEVICE AND METHOD FOR FILTERING, DECIMATION AND TRANSPOSITION INTO DISTRIBUTED BASEBAND AND CORRESPONDING DIGITAL MODULATOR

BACKGROUND OF THE INVENTION

The field of the invention is that of data transmission, in particular of the frequency division multiple access (FDMA) type, consisting in transmitting a frequency multiplex of channels.

In general, each channel of the multiplex is associated with a carrier frequency and with a data rate. In the present case, the carrier frequency and the data rate of each channel can be completely arbitrary.

More precisely, the invention relates to a digital method and to digital apparatus for filtering, decimating, and transposing into baseband a particular channel of a frequency multiplex. In other words, the present invention relates to a method and to apparatus serving to extract a particular channel referred to as the "channel of interest" from a frequency multiplex of channels, and to transpose it into baseband, and to do so while reducing the oversampling factor of said channel of interest.

In conventional manner, the operations of filtering, decimation, and transposition are implemented in a demodulator capable of receiving a frequency multiplex, and they are performed prior to other operations, for example operations such as filtering, reception, interpolation, synchronization, decoding, etc.

Also in conventional manner, it is assumed below in the present description that the frequency multiplex has already been transposed to an intermediate frequency or indeed is already in baseband. It is recalled that when a multiplex is in baseband that does not necessarily mean in any way that the channel of interest within said multiplex is itself in baseband. Consequently, it is clear that the invention (which seeks to bring the channel of interest into baseband) is applicable to both of the above cases.

The present invention relates solely to digital type processing (filtering, decimating, and transposing). In order to take maximum advantage associated with digital technology (reproducibility, precision, flexibility of design rules, . . . ), it is desirable for certain tasks that have traditionally been performed in the analog domain to be performed in completely digital manner.

This means that the frequency multiplex as a whole has already been digitized (sampled and subjected to analog-to-digital conversion). In other words, the entire frequency multiplex has been sampled at a rate that is relatively high because its band is still complete (for example the sampling rate may lie in the range 40 MHz to 60 MHz).

Since the channel of interest (the channel that is to be extracted and transposed into baseband) is of narrow width compared with the sampling frequency, it is desirable to reduce the oversampling on said channel of interest to a moderate value (4 to 8 samples per symbol, for example). Typically, the data rates processed lie in the range 10 kbit/s to 500 kbit/s, for example.

This reduction of oversampling is performed by an operation known as "decimation" which consists in selecting one out of every n samples. The factor n is referred to as the "decimation" factor.

In conventional manner, the operation of decimation is preceded by a filtering operation. Decimation produces aliasing. Efficient filtering purges the frequency band in those locations where information-carrying spectrum components are going to be aliased.

It is also desired to transpose the channel of interest into baseband so as to make subsequent processing possible (filtering, reception, interpolation, synchronization, decoding, etc.). The channel of interest is located at an arbitrary frequency within the multiplex and indeed there is no guarantee that the multiplex is itself centered on zero frequency.

A digital demodulator can solve the problem of frequency divided channels by using a decimating filter that has a tree structure. Each stage of the structure has two branches, each branch performing filtering on a sub-band equal to half the total band it receives, followed by decimation by two. The tree structure makes it possible to extract simultaneously as many distinct channels as it possesses outputs, i.e. $2_E$ distinct channels where E is the number of stages. It is also important to observe that the tree structure does not require any specific transposition means, since the filtering and decimation performed at each stage bring the carriers of the various channels progressively towards zero frequency.

Unfortunately, such a tree structure suffers from the major drawback of being unsuitable for use with an arbitrary multiplex. A tree structure requires the channel carriers to be distributed in a very specific manner within the multiplex. More precisely, each channel carrier must occupy an initial position within the multiplex such that at each stage it is to be found exactly within one of the two filtering sub-bands. It will be understood that if at the input to a given stage (i.e. at the output from the decimator of the preceding stage) a carrier lies at the boundary between the sub-bands associated with the two filters of the stage (overlap of transition zones), then it runs the risk of being conserved by neither of the two filters.

Furthermore, the tree structure is designed to extract all of the channels of the multiplex and such a structure is therefore excessive when only one channel is to be extracted from a plurality of channels.

In the state of the art, solutions are also known relating solely to the pair of operations comprising filtering and decimation. Those prior solutions recommend avoiding only one step of filtering for high rates of decimation. Such an approach would require a large fraction of the frequency band to be filtered so as to leave room for the large amount of aliasing produced by high rates of decimation. Unfortunately, such a constraint means that the transition zone of the filter performing the rejection operation is narrow, which can only be achieved by a digital filter that is defined by a large number of coefficients, with each of the coefficients also needing to be quantified with precision, i.e. it can only be achieved at the cost of a large number of elementary operations on bits.

Known filtering and decimation solutions tend rather to subdivide the filtering function into two or three stages. This provides advantages in terms of overall complexity, since the number of operations performed in each stage is significantly reduced. However, in those known solutions, the configuration of the various successive stages is specific to the carrier and to the data rate of the channel that is to be extracted. In other words, at each stage, filtering is adapted to the characteristics (carrier and data rate) of a particular channel. Consequently, as a general rule, two successive stages are not identical. In addition, a given filtering and decimation apparatus is not simple to use for two distinct channels of interest. Under such circumstances, all of the filtering and decimation parameters in each stage need to be updated individually.

In other words, those known solutions for filtering and decimation suffer from the major drawback of requiring large capacity storage for storing several sets of filtering and decimation coefficients, and also of requiring a mechanism for selecting between pertinent sets of coefficients. In addition, since the stages are completely different from one another, there is no possibility of implementing them by sharing a common computation resource.

Elsewhere, for the problem of transposition, a commonly adopted solution consists in transposing the entire multiplex once so as to center the channel of interest on zero frequency. In this way, the above-mentioned known solutions for filtering and decimation in which filtering is centered likewise on zero frequency, can be used to extract the channel of interest and to decimate it.

Such transposition is not very advantageous. It needs to be performed immediately after the analog-to-digital converter, and therefore at the high sampling frequency that is imposed thereby. Unfortunately it would be more advantageous to minimize the sampling frequency before proceeding with transposition into baseband. It is recalled that the values that are accessible by frequency transposition are, by their very nature, quantified, and that as a result, for given precision, the fineness of such transposition decreases with increasing sampling frequency. This precision is represented by the size of the memory for storing the accessible transposition values. In addition, since the band is still complete at this stage, the width of the frequency range to which the transposition must be applied is at its maximum.

A particular object of the invention is to mitigate those drawbacks of the prior art.

More precisely, an object of the present invention is to provide a digital method and apparatus for filtering, decimating, and transposing into baseband, which method and apparatus are of hardware cost that is reduced compared with the above-mentioned known solutions.

SUMMARY OF THE INVENTION

Another object of the invention is to provide such apparatus and such a method that impose no constraint on the frequency multiplex (and in particular do not require any particular distribution of channel carriers within the multiplex).

Another object of the invention is to provide such apparatus and such a method in which it is possible for some of the stages to be identical in terms of design structure and hardware.

A further object of the invention is to provide such apparatus and such a method in which the number and the configuration of the various stages are not specific either to the carrier or to the data rate of each channel that is to be extracted, but depend solely on the initial and final oversampling factors.

These various objects, and others that appear below, are achieved by the invention by means of apparatus for filtering, decimating and transposing into baseband, the apparatus being of entirely digital type, and serving both to extract and transpose into baseband one of the channels, referred to as the "channel of interest", of a frequency multiplex of channels, and also to reduce the oversampling factor of said channel of interest, each channel being associated with a distinct carrier, the said apparatus comprising at least two stages in cascade, each stage comprising filter means and decimation means, said filter means being placed upstream from said decimation means and enabling a portion of the spectrum to be purged at locations where the decimation means produce aliasing, the apparatus being characterized in that each stage also comprises transposition means placed upstream from said filter means and associated with a transposition frequency previously selected from a set of N possible distinct transposition frequencies so as to transpose the carrier associated with said channel of interest as close as possible to zero frequency.

The general principle of the invention thus consists in sharing frequency transposition between the various stages of the structure. Thus, the channel of interest is transposed into baseband in successive steps, and each transposition step can be wide. The transposition means of each stage can therefore be less complex than when transposition is performed on a single occasion only.

If necessary, the last stage can be followed by fine transposition means so as to perfect transposition into baseband.

The invention puts no constraints on the frequency multiplex. In other words, the carrier and the data rate of the channel of interest can be arbitrary. The transposition performed at the input to each stage ensures that the channel of interest is correctly filtered (i.e. without any information being lost).

The invention also makes it possible to use transposition means that are not very complex because of the synergy that exists between the transposition performed in a given stage and the decimation performed in the preceding stage. Because of the decimation performed in the preceding stage, the sampling frequency of a given stage is less than that of the preceding stage. Consequently, for the same granularity of transposition (i.e. for the same difference between two transposition frequencies, expressed as a function of the sampling frequency), the transposition performed at a given stage is finer than that performed at the preceding stage. In other words, decimation produces a magnifying-glass effect which avoids the need to make transposition more and more precise on going from stage to stage.

Advantageously, said decimation means are identical in all of the stages. In this way, the channel of interest can be changed without modifying the decimation means.

Advantageously, the decimation means of each stage have a decimation factor equal to two. Thus, the filtering performed at each stage does not need to be very powerful.

Preferably, said filter means perform half-band lowpass filtering. Thus, the invention can be implemented using half-band filters, which are the simplest filters to make.

Advantageously, the filter means of a given stage perform half-band lowpass filtering with a transition zone that is at least as narrow as that of the half-band lowpass filtering performed by the filter means of the stage preceding said given stage.

In this way, the filters can be simpler the closer they are to the beginning of the system, and this point is advantageous since the early stages operate at higher speeds than the later stages. In other words, this makes it possible for the filters in the earlier stages to relax specifications for oscillation in the band, and thus makes it possible to reduce the number of coefficients they use.

In a preferred embodiment of the invention, said transposition means of each stage perform complex multiplication by a transposition coefficient:

$$C = e^{-j \cdot 2\pi f_t \cdot kT_e}$$

$f_t$ being said transposition frequency of said stage as previously selected from a set of N possible distinct transposition frequencies so as to transpose the carrier associated with said channel of interest as close as possible to zero frequency; and $kT_e$ being the case sampling instant, k being an integer that increases with time, and $T_e = 1/f_e$ with $f_e$ being the sampling frequency of said stage.

It is recalled that the fineness of the transposition performed in a stage increases with increasing number N of possible distinct transposition frequencies (and thus with deceasing transposition granularity).

Advantageously, said transposition frequency $f_t$ of said stage is written: $f_t = (l \cdot f_e)/N$, where l is an integer lying in the range 0 to N−1.

In an advantageous variant, said transposition frequency ft of said stage is written: $f_t = (f_e/(2N)) \cdot (2l+1)$, where l is an integer lying in the range 0 to N−1.

It should be observed that in the above two cases, the granularity of the transposition performed at each stage is equal to $f_e/n$, and the transposition coefficient C can take on N distinct values (modulo N) for N successive sampling instants.

Preferably, at least two successive stages, including the first stage, are identical, with only said transposition frequency being specific to each stage, and said at least two successive identical stages are implemented using a single hardware cell whose transposition, filter, and decimation means are shared by said at least two successive identical stages.

The term "identical stages" is used to mean stages having transposition means, filter means, and decimation means that are identical. For the transposition means, this implies that the sets of N possible transposition frequencies of the various stages are identical. Naturally, this does not mean that the selected transposition frequency is the same for all of the identical stages.

Thus, by sharing hardware resources for implementing identical stages, a significant saving in computation power is achieved (and thus in ASIC surface area). All identical stages are implemented using a single hardware cell that operates fast enough to be able to perform all of the processing in parallel. This parallel processing is made possible by the fact that each successive stage operates more slowly than the preceding stage (because of the decimation).

Preferably, the fineness of the transposition performed by the transposition means of a given stage is greater than or equal to the fineness of the transposition performed by the transposition means of the stage preceding said given stage.

In this way, transposition can be simpler closer to the start of the system, and this point is advantageous since the early stages operate faster than the later stages. In other words, transpositions that require more computation (i.e. that are finer) are performed at slower operating speeds (or sampling frequencies).

Advantageously, as a function of the initial and final oversampling factors of said channel of interest, respectively at the input to and at the output from said apparatus, said frequency multiplex of channels is applied directly to an appropriate stage situated downstream from the first stage.

In other words, depending on the initial amount of oversampling, it can be decided to avoid passing the signal through one or more of the first stages, by passing it directly into an intermediate stage.

The invention also provides a method of filtering, decimating and transposing into baseband, the method being of the entirely digital type and enabling both a particular channel referred to as the "channel of interest" in a frequency multiplex of channels to be extracted and transposed into baseband, and also the oversampling factor of said channel of interest to be reduced, each channel being associated with a distinct carrier, the method being characterized in that the operations of filtering, decimation, and transposition into baseband are performed in at least two successive processing stages where each processing stage comprises the following successive steps:

transposition enabling the carrier associated with said channel of interest to be transposed as close as possible to zero frequency;

filtering; and decimation, said filtering step serving to purge a portion of the spectrum in locations where the decimation step produces aliasing.

Advantageously, said method comprises a preliminary stage of determining the number of successive processing stages and the transposition, filter, and decimation characteristics of each of said processing stages, the decimation factor of each stage being assumed to be known, the initial oversampling factor input to the first stage being assumed to be known, a maximum oversampling factor at the output from the last stage being imposed, said preliminary stage comprising the following steps:

with respect to the last processing stage: the optimum transposition characteristics (in terms of fineness of transposition) and filtering characteristics (in terms of difference from ideal filtering) are determined that enable said imposed maximum oversampling factor at the output from said last processing stage to be obtained;

with respect to the penultimate processing stage:

on the basis of the decimation factor of the last processing stage and on the basis of the maximum oversampling factor imposed at the output from the last processing stage, a maximum oversampling factor required at the output from said penultimate processing stage is calculated; and the optimum transposition characteristics and filter characteristics are determined enabling said maximum oversampling factor required at the output from said penultimate processing stage to be obtained;

the same reasoning is repeated until an earlier processing stage referred to as the "first" processing stage is obtained such that when said initial oversampling factor is applied thereto, then the oversampling factor at the output from said first processing stage is less than that previously calculated maximum required oversampling factor.

This prior stage makes it possible to optimize the filters of the various stages individually, starting with the last stage and working back towards the first.

Preferably, said preliminary stage also comprises a final step consisting in:

for the last or the last X processing stages where $X \geq 1$: retaining the optimum transposition and filter characteristics specific to each processing stage; and for each of the L-X first processing stages, where L is the total number of processing stages and $L-X \geq 2$: replacing the optimum transposition of filter characteristics specific to each processing stage with common transposition of filter characteristics equal to those of the L-Xth processing stage.

It appears that from a certain stage (the L-Xth in the present notation) and going back to the first stage, the filtering is extremely simple to perform so there is little to be gained in terms of complexity by optimizing each filter stage individually. Under such circumstances, it is preferable to make the filter stages identical, thus making it possible to implement all of them using a single hardware cell.

The invention also provides a digital demodulator of the type comprising at least one single channel demodulation system, with each system including apparatus as specified above for filtering, decimating, and transposing into baseband.

Other characteristics and advantages of the invention appear on reading the following description of two preferred embodiments of the invention, given by way of non-limiting example and with reference to the accompanying drawings, in which:

Figure 3:
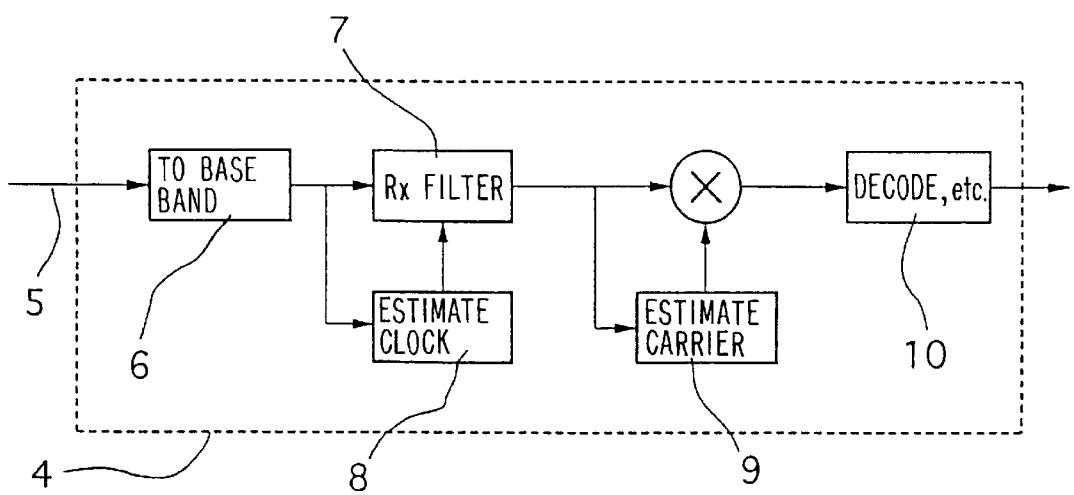
FIG. 3 is a simplified block diagram of a particular embodiment of a single-channel demodulation system shown in FIG. 2.
Figure 4:
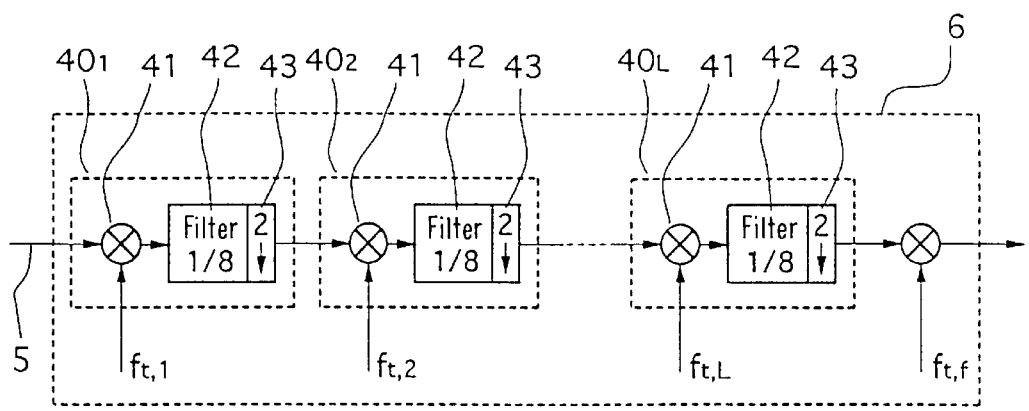
FIG. 4 shows a first embodiment of apparatus of the invention for filtering, decimating, and transposing into baseband, as shown in FIG. 3.
Figure 5A:
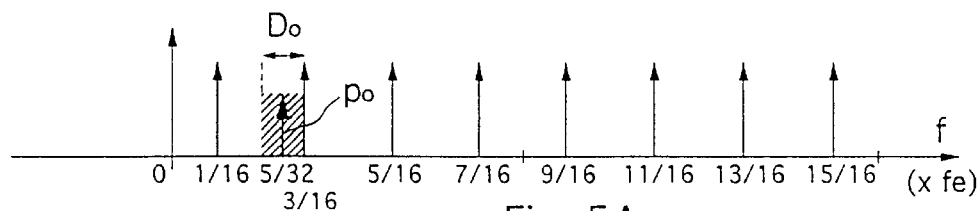
FIGS. 5A to 5E constitute an example for explaining the operation of the apparatus of FIG. 4, each figure showing the same channel of interest at different points in the apparatus, specifically.
Figure 5B:
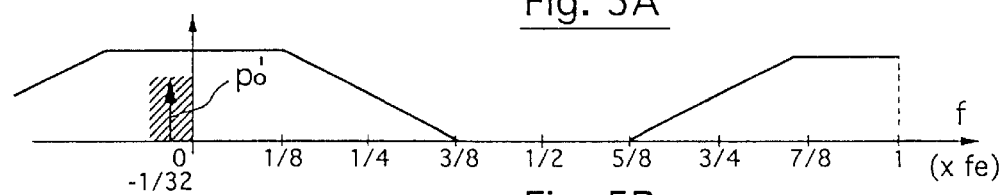
Figure 5C:
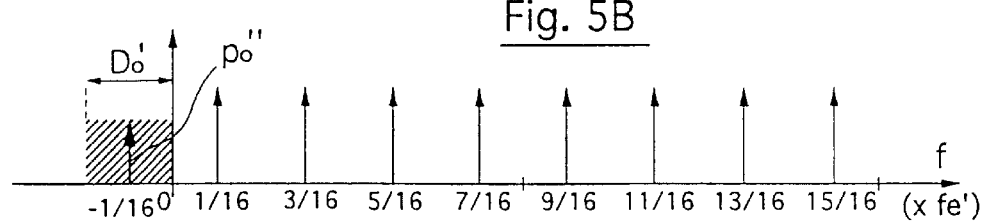
Figure 5D:
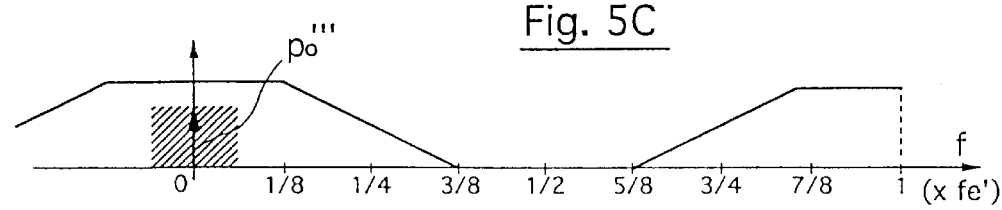
Figure 5E:
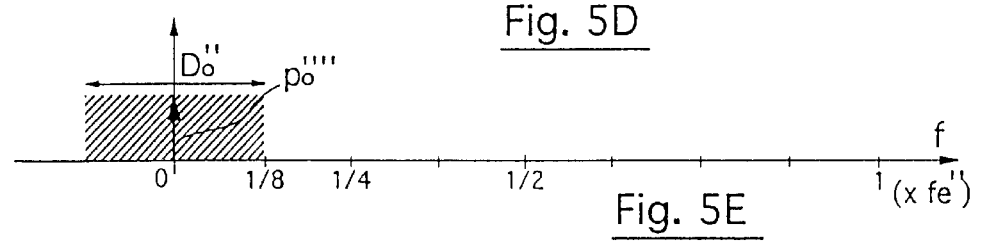
Figure 6:
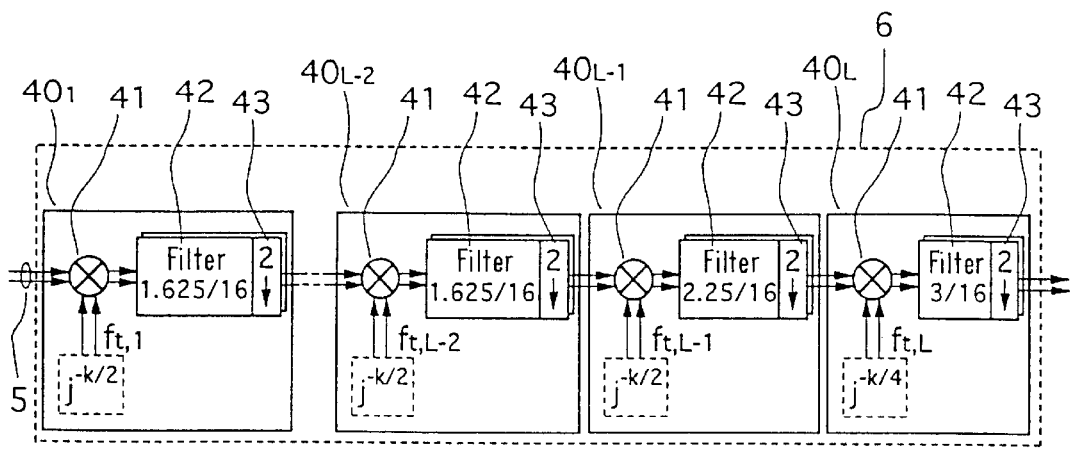
Figure 7:
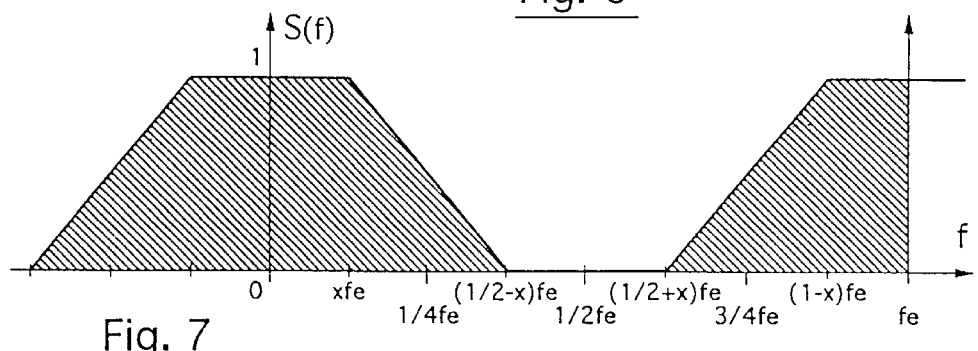
Figure 8:
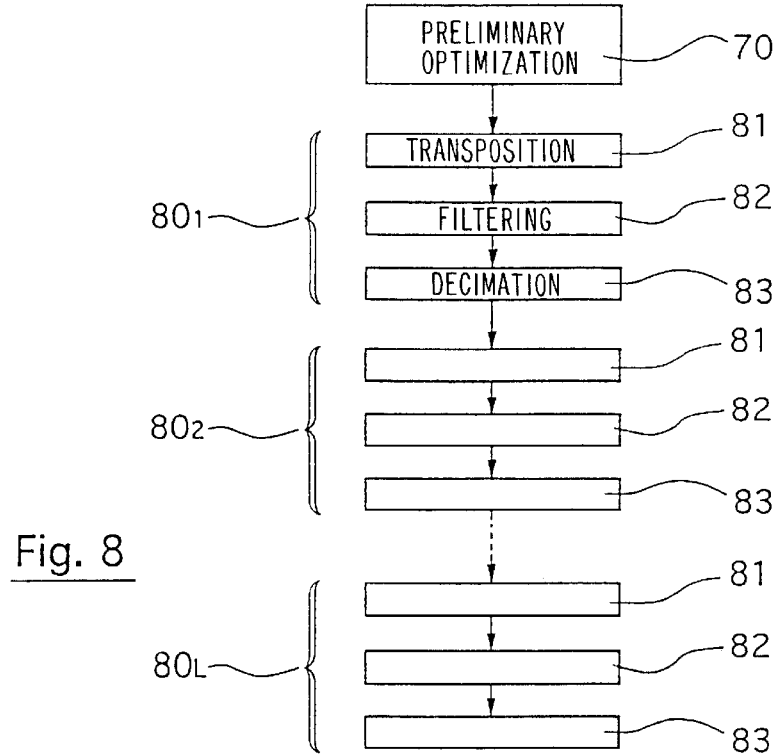

on input to the first stage (FIG. 5A);
after the transposition means of the first stage (FIG. 5B);
after the filter and decimation means of the first stage (FIG. 5C);
after the transposition means of the second stage (FIG. 5D);
after the filter and decimation means of the second stage (FIG. 5E);

FIG. 6 shows a second embodiment of the apparatus of the invention for filtering, decimating, and transposing into baseband, as shown in FIG. 3;

FIG. 7 shows the frequency response of a family of "half-band" filters suitable for use in the apparatus of FIG. 4 or FIG. 6; and FIG. 8 is a simplified flow chart of a particular implementation of the method of the invention for filtering, decimating, and transposing into baseband.

Figure 1:
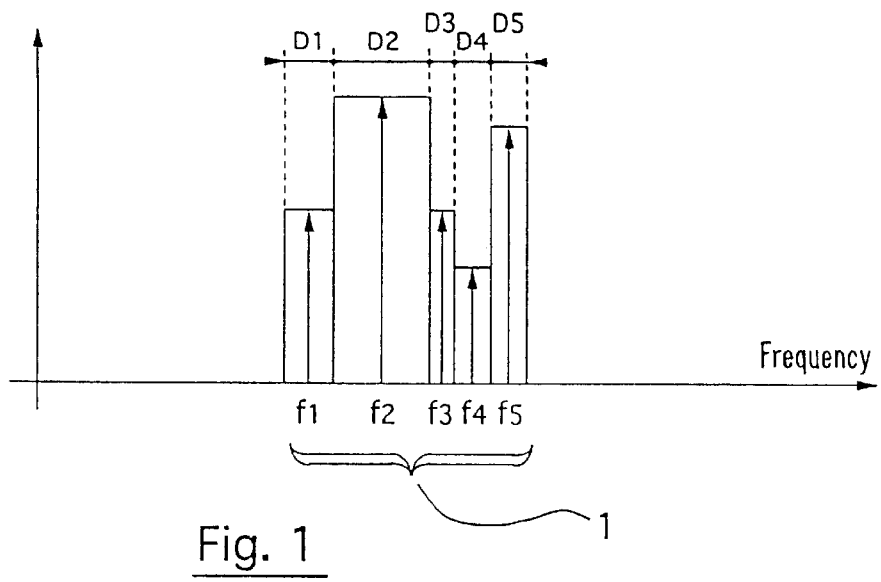
FIG. 1 shows an example of a frequency multiplex received by apparatus of the invention for filtering, decimating, and transposing into baseband.

In general, and as shown in the example of FIG. 1, a multiplex 1 comprises a plurality of channels each associated with a respective carrier $f_1$ to $f_5$ and a respective data rate D1 to D5.

DETAILED DESCRIPTION OF THE INVENTION

The invention relates to a method and apparatus for filtering, decimating, and transposing into baseband one of the channels of such a frequency multiplex 1 (which channel is referred to as the "channel of interest").

Figure 2:
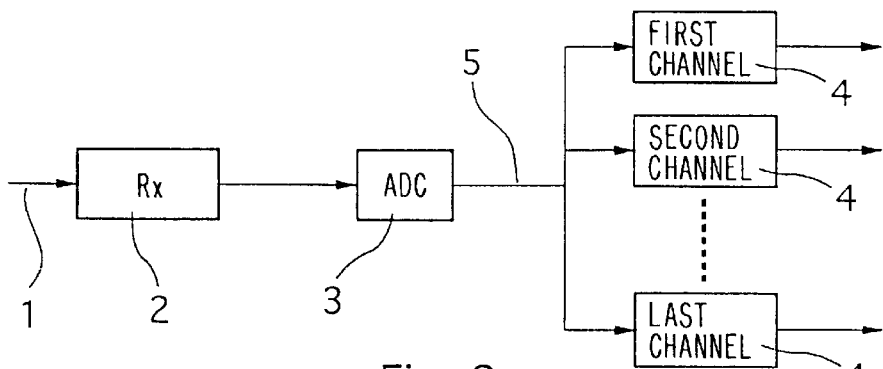
FIG. 2 is a simplified block diagram of a particular embodiment of a demodulator of the invention.

The invention also provides a digital demodulator including such apparatus. In a particular embodiment, as shown in the diagram of FIG. 2, the demodulator of the invention comprises a receiver system 2, analog-to-digital conversion means 3 and a plurality of single channel demodulation systems 4 (also referred to as single carrier demodulation systems).

The receiver system 2 is broad-band since it must be capable of receiving the entire multiplex 1, and it operates at intermediate frequency, assuming that the multiplex 1 is initially transposed to intermediate frequency.

The analog-to-digital conversion means 3 serve to digitize the entire received multiplex 1. The frequency at which analog-to-digital conversion is performed (known as the "sampling" frequency) is selected as a function of the band of the frequency multiplex 1. As a result, the sampling rate of the digitized multiplex 5 is much higher than the symbol rate of the channel of interest. In other words, the width of the channel of interest is small compared with the sampling frequency.

Finally, each single channel demodulation system 4 serves to process one of the channels of the digitized multiplex 5.

In the example shown in FIG. 2, the demodulator comprises a plurality of single channel demodulation systems 4. Nevertheless, it is clear that the demodulator of the invention could have only one single channel demodulation system 4.

As shown in FIG. 3, in a particular embodiment, each single channel demodulation system 4 comprises apparatus 6 for filtering, decimating, and transposing into baseband, receive filter means 7, clock estimator means 8, carrier estimator means 9, and means 10 for performing various other functions (in particular decoding).

With the exception of the apparatus 6 for filtering, decimating, and transposing, the various other above-mentioned means 7 to 10 all operate in baseband. They are therefore entirely conventional and the person skilled in the art can implement them easily.

In contrast, the filter, decimation, and transposition apparatus 6 must operate at a much higher frequency and therefore constitutes a critical point. The present invention proposes architecture that is simple and effective for implementing this apparatus 6.

First and second embodiments of the apparatus 6 of the invention for filtering, decimating, and transposing into baseband are described below. The first embodiment is described with reference to FIGS. 4 and 5A to 5E. The second embodiment is described with reference to FIGS. 6 and 7.

In both embodiments described (cf. FIGS. 4 and 6), the apparatus 6 comprises a plurality of stages $40_1$ to $40_L$ in cascade. Each stage $40_1$ to $40_L$ has transposition means 41, filter means 42, and decimation means 43.

The transposition means 41 placed at the input of the stage are associated with a transposition frequency $f_{t,1}$ to $f_{t,L}$ previously selected from a set of N possible distinct transposition frequencies. They enable the carrier associated with the channel of interest to be transposed as close as possible to zero frequency.

The transposition means 41 in each stage $40_1$ to $40_L$ perform complex multiplication by a transposition coefficient: $C_i = e^{-j \cdot 2\pi \cdot f_{t,i} \cdot kT_e}$ $f_{t,i}$ being the transposition frequency of the ith stage; and
$kT_e$ being the kth sampling instant, where k is an integer that increases with time, and $T_e = 1/f_e$ where $f_e$ is the sampling frequency of the ith stage.

Once the transposition frequency $f_{t,i}$ has been selected it remains fixed. In contrast, the transposition coefficient $C_i$ varies over time (i.e. with varying k).

It is important to observe that because of the decimation (41) performed at each stage, each stage $40_1$ to $40_L$ possesses its own sampling frequency (which decreases with closeness of the stage to the output of the apparatus 6).

The transposition frequency $f_{t,i}$ of the ith stage can be defined in several ways. Two possible definitions are given below. It is clear that other definitions could be envisaged by the person skilled in the art without going beyond the ambit of the present invention.

In a first definition, the frequencies written: $f_{t,i}=(l\cdot f_e)/N$ where l is an integer lying in the range 0 to N−1. By using the N distinct values of l, a set of N possible distinct transposition frequencies is obtained. Thus, for example, if N=8, the following set of transposition frequencies is obtained: $f_t \in \{0, f_e/8, 2f_e/8, 3f_e/8, 4f_e/8, 5f_e/8, 6f_e/8, 7f_e/8\}$.

In a second definition, the transposition frequency $f_{t,i}$ of the ith stage is written: $f_t=(f_e/(2N))\cdot(2l+1)$, where l is an integer lying in the range 0 to N−1. As before, by taking the N distinct values for l, a set of N possible distinct transposition frequencies is obtained. Thus, for example, if N=8, the following set of transposition frequencies is obtained: $f_t \in \{f_e/16, 3f_e/16, 5f_e/16, 7f_e/16, 9f_e/16, 11f_e/16, 13f_e/16, 15f_e/16\}$.

In general, the fineness (or precision) of a transposition is evaluated in terms of its granularity G which is the minimum spacing between two possible transposition frequencies. Thus, with the two above-specified definitions: $G=f_e/N$. It will be observed that the precision of transposition increases (i.e. its granularity decreases) with increasing N.

Furthermore, with the two above-specified definitions for the transposition frequency, the transposition coefficient $C_i$ varies with k modulo N. The frequency can take on only N distinct values. Using the first definition for transposition frequency, it is common practice to use the notation $j^{-4l/N}$ for this set of N distinct values of the transposition coefficient. Thus, for example, for N=4 this gives $j^{-l}$; for N=8 it gives $j^{-l/2}$ and for N=16 it gives $j^{-l/4}$.

The filter means 42 are placed upstream from the decimation means 43. They serve to purge a portion of the spectrum at locations where the decimation means 43 produce aliasing.

FIG. 7 shows the frequency response of a family of "half-band" filters suitable for use in both the first and the second embodiments of the apparatus 6. When normalized, this frequency response is written as follows:

$$S(f) = 1 \quad \text{for } f \in [0, x \cdot f_e]$$

$$= (1/(4x-1))\cdot(2f/f_e + 2x - 1) \quad \text{for } f \in \left[x\cdot f_e, \left(\frac{1}{2}-x\right)\cdot f_e\right]$$

$$= 0 \quad \text{for } f \in \left[\left(\frac{1}{2}-x\right)\cdot f_e, \left(\frac{1}{2}+x\right)\cdot f_e\right]$$

$$= (1/(4x-1))\cdot(-2f/f_e + 2x + 1) \quad \text{for } f \in \left[\left(\frac{1}{2}+x\right)\cdot f_e, (1-x)\cdot f_e\right]$$

$$= 1 \quad \text{for } f \in [(1-x)\cdot f_e, f_e]$$

Each filter of this family corresponds to a particular value of the maximum frequency x of the passband, with $x \in [0, \frac{1}{4}]$. The value $x=\frac{1}{4}$ corresponds to an ideal half-band filter since the transition gap $[x\cdot f_e, (\frac{1}{2}-x)\cdot f_e]$ is reduced to zero therein (infinite transition slope). In reality, the steeper the transition slope of the filter, the harder it is to make the filter.

In the two embodiments shown, the decimation means 43 are identical for all of the stages $40_1$ to $40_L$, and they perform decimation by two. It is recalled that such a decimation factor has the advantage of not requiring very powerful prior filtering.

Optionally (cf. FIG. 4), the last stage $40_L$ can be followed by fine transposition means 44 so as to refine transposition into baseband.

In the first embodiment of the apparatus (cf. FIG. 4), the filter means 42 are identical for all of the stages $40_1$ to $40_L$, and they perform half-band filtering with $x=\frac{1}{8}$. The transposition means 41 are also taken to be identical for all of the stages $40_1$ to $40_L$. In other words, all of the stages have the same set of N possible distinct transposition frequencies, and it is only the particular transposition frequency selected out of the N possible frequencies in the set that is specific to each stage.

Thus, in the first embodiment, all of the stages $40_1$ to $40_L$ are identical (same transposition means 41, same filter means 42, and same decimation means 43). They can be implemented using a single hardware cell providing it can operate fast enough to perform the processing of all of the stages in parallel. Hardware implementation is thus very simple.

It should be observed that if the first stage $40_1$ requires processing at a rate of $f_e$ (sampling frequency), then the second stage 402 can make do with processing at half the rate $f_e/2$ (because of the decimation by two performed in the first stage), the third stage $40_3$ can make do with processing at a rate $f_e/4$ (because of the decimation by two performed in the second stage), etc. The first stage is the most demanding. Ignoring initialization and transfer operations, the first stage requires more processing power than all of the following stages combined (where "more" tends to "equal" as the number of stages tends to infinity). In a cascade of three stages, the most efficient processing rate is four times in the first stage, twice in the second stage, and once in the third stage, and then starting over. It will be observed that this scheme is consistent with the sampling frequencies imposed at the successive stages.

An example of how the apparatus 6 of FIG. 4 operates is described below with reference to FIGS. 5A to 5E. Each figure shows the same channel of interest (shown shaded) at different points in the apparatus.

It is assumed that at the input to the first stage (cf. FIG. 5A), the channel of interest (i.e. the channel which is to be extracted from the multiplex and transposed into baseband) is associated with a carrier $p_0=(5/32)\cdot f_e$ (where $f_e$ is the sampling frequency in the first stage $40_1$) and has a data rate $D_0=(1/16)\cdot fe$. It is also assumed that N=8 and that the following set of transposition frequencies is used: $f_t \in \{f_e/16, 3f_e/16, 5f_e/16, 7f_e/16, 9f_e/16, 11f_e/16, 13f_e/16, 15f_e/16\}$.

The transposition frequency $3f_e/16$ is the closest to the carrier $p_0$. Consequently, this is the frequency which is selected for the first stage. In reality, transposition is performed using $(-f_t)$, where $f_t$ is the transposition frequency.

After the transposition means 41 of the first stage (cf. FIG. 5B), the carrier has become: $p_0'=(5/32-3/16)\cdot f_e=(-1/32)\cdot f_e$. As can be seen in FIG. 5B, the half-band filtering 42 (whose frequency response is shown) can be performed without giving rise to any losses for the data channel.

FIG. 5C shows the channel of interest at the input to the second stage, i.e. after the filter means 42 and the decimation means 43 of the first stage. The frequencies are now written as a function of $f_e'$, where $f_e'$ is the sampling frequency after decimation by two $(f_e'=f_e/2)$ Thus: $p_0''=(-1/16)\cdot f_e'$ and $D_0'=(1/8)\cdot f_e'$.

The transposition frequency $-f_e/16$ is the closest to the carrier $p_0$. Consequently, the transposition frequency $15f_e/16$ is selected for the second stage. Transposing by $15f_e/16$ is equivalent to transposing by $-f_e/16$.

After the transposition means 41 of the second stage (cf. FIG. 5D), the carrier has become: $p_0'''=(-1/32+1/32) \cdot f_e = 0$. The channel of interest has thus been brought to baseband and the half-band filtering 42 (whose frequency response is shown) can be performed without giving rise to losses for the data channel.

FIG. 5E shows the channel of interest after the filter means 42 and the decimation (by two) means 43 of the second stage. The frequencies are now written as a function of $f_e''$, where $f_e''$ is the sampling frequency after decimation by two ($f_e''=f_e'/2=f_e/4$) Thus: $p_0''''=0$ and $D_0=f_e/4$.

It is recalled that the oversampling S at a point is defined as the ratio of the sampling frequency $f_e$ divided by the data rate D at said point: $S=f_e/D$. In the example described above, the oversampling at the input of the apparatus 6 is $S_e=f_e/D_0=16$. The oversampling at the output of the apparatus 6 is $S_s=f_e''/D_0''=f_e''/(f_e/4)=4$.

In the example described above with reference to FIGS. 5A to 5E, and which is given purely by way of explanation, the apparatus 6 has two stages and serves to bring the channel of interest into baseband and to reduce the oversampling factor to $S=4$.

In the second embodiment of the apparatus (cf. FIG. 6), the transposition means 41 and the filter means 42 are not identical in all of the stages $40_1$ to $40_L$. In this case, the transposition and filtering characteristics of each stage are selected so as to be optimum. As explained below, when stages differ little, it is advantageous to force them to be identical. This loses little in terms of optimum filtering and transposition, while gaining greatly in terms of computation power and (thus in terms of surface area for an ASIC) since it is possible to use a single hardware cell to implement all of the stages that are identical.

With reference to FIG. 6, there follows a description of the method for optimizing the number of stages and the transposition and filter characteristics of each of said stages.

It is assumed that the sole parameter for optimization is the oversampling S required at the output from the apparatus 6. For example it can be required that S does not exceed 4.48, i.e. that the last stage $40_L$ guarantees at its output that $S \in [2.24; 4.48]$.

It is also assumed that the filters used are of the half-band type (cf. above explanation, with reference to FIG. 7). The maximum frequency of the passband is written x, assuming that the sampling frequency $f_e$ is normalized as 1.

Consideration is given initially to the last stage $40_L$. Two cases are investigated:

either the fineness of the transposition of the last stage is $f_e/8$ (i.e. N=8), so in the worst case: $1/[2 \cdot (x-1/16)]=\text{Smax}/(1+\alpha)$ where $\alpha$ is the roll-off of the matched filter. This gives: $x=1/16+(1+\alpha)/(2 \cdot \text{Smax})$.

Numerical example: with $\alpha=0.4$ and Smax=4.48, then: $x=3.5/16$. It is observed that this value is very close to the limit value $x_f=1/4=4/16$. The difficultly lies in making a filter whose transition is that sharp. A second case is thus also considered.

or else the transposition of the last stage has fineness of $f_e/16$ (i.e. N=16), then in the worst case: $1/[2 \cdot (x-1/32)]=\text{Smax}/(1+\alpha)$ where $\alpha$ is the roll-off of the matched filter. This gives $x=1/32+(1+\alpha)/(2 \cdot \text{Smax})$. Numerical example: with a $\alpha=0.4$ and Smax=4.48, then $x=3/16$. This value is more reasonable. It is the value adopted in practice.

Consideration is now given to the penultimate stage $40_{L-1}$. In compliance with the general architecture, it is necessary (and it suffices) for the oversampling at the output of this stage to satisfy $S \in [4.48; 8.96]$. It is assumed that the transposition of the penultimate stage has fineness $f_e/8$, so in the worst case: $1/[2 \cdot (x-1/16)]=\text{Smax}/(1+\alpha)$ where $\alpha$ is the roll-off of the matched filter. This gives: $x=1/16+(1+\alpha)/(2 \cdot \text{Smax})$. Digital application: with $\alpha=0.4$ and Smax=8.96, then $x=2.25/16$.

Consideration is then given to the preceding stage $40_{L-2}$. It is necessary for the oversampling to satisfy $S \in [8.96; 17.92]$. It is assumed that the transposition of the penultimate stage has fineness $f_e/8$, so in the worst case: $1/[2 \cdot (x-1/16)]=\text{Smax}/(1+\alpha)$ where $\alpha$ is the roll-off of the matched filter. This gives: $x=1/16+(1+\alpha)/(2 \cdot \text{Smax})$. Numerical example: with $\alpha=0.4$ and Smax=17.92, then $x=1.625/16$.

The same reasoning can be applied iteratively all the way to the first stage $40_1$, i.e. to a stage which is capable of receiving the frequency multiplex 5 with a predetermined oversampling factor at its input. A method has thus been described for optimizing the transposition means 41 and the filter means 42 of each stage, working back from the last stage and its oversampling constraints all the way to the first stage. It will be observed that the transposition and filter means 41, 42 become simpler on getting closer to the beginning of the sequence, which is advantageous since it is the earlier stages that operate fastest.

If it is desired to have a structure that is more general (i.e. capable of being used with various channels of interest), it is possible to provide a large number of stages and, as a function of the input oversampling factor, to apply the multiplex directly to an appropriate stage situation downstream from the first stage. In other words, only the minimum number of stages required is then used (omitting one or more initial stages).

In the example shown, it can be seen that as from the antepenultimate stage $40_{L-2}$, the filters 42 are extremely simple to make, and that there is little advantage in optimizing them individually. Under such circumstances, it is preferable for the L-2 first stages $40_1$, to $40_{L-2}$ to be identical. Generalizing, one can speak of the L-X first stages. In this way, it is possible to share hardware resources that are to perform the various stages. To sum up, in this variant (cf. FIG. 6), there are L-2 identical first stages $40_{L-1}$, to $40_{L-2}$, followed by two special stages $40_{L-1}$ and $40_L$.

A particular implementation of the method of the invention for filtering, decimating, and transposing into baseband is described below with reference to the flow chart of FIG. 8. The operations of filtering, decimation, and transposition into baseband are performed in at least two successive processing stages $80_1$ to $80_L$. Each processing stage comprises the following successive steps:

transposition 81 serving to transpose the carrier associated with the channel of interest as close as possible to zero frequency;

a filtering 82;

decimation 83, with the filtering step 82 serving to purge a portion of the spectrum at locations where the decimation step 83 produces aliasing.

Each processing stage $80_1$ to $80_L$ can be implemented, for example, one of the stages $40_1$ to $40_L$ of the apparatus 6 described above with reference to FIGS. 1 to 7.

The method also includes a preliminary stage 70 of determining the number of successive processing stages and the transposition, filtering, and decimation characteristics of each of the processing stages $80_1$ to $80_L$. In the invention, this preliminary stage 70 can be optimized. This is the above-described optimization of the number of stages in the apparatus 6 for filtering, decimating, and transposing into baseband, and of the transposition and filter characteristics for each of its stages $40_1$ to $40_L$.

What is claimed:

1. Apparatus for filtering, decimating and transposing into baseband, the apparatus being of entirely digital type, and serving both to extract and transpose into baseband one of the channels, referred to as the "channel of interest", of a frequency multiplex of channels, and also to reduce the oversampling factor of said channel of interest, each channel being associated with a distinct carrier, the said apparatus comprising at least two stages in cascade ($40_1$ to $40_L$), each stage comprising filter means (42) and decimation means (43), said filter means being placed upstream from said decimation means and enabling a portion of the spectrum to be purged at locations where the decimation means produce aliasing, the apparatus being characterized in that each stage ($40_1$ to $40_L$) also comprises transposition means (41) placed upstream from said filter means (42) and associated with a transposition frequency ($f_{t,i}$) previously selected from a set of N possible distinct transposition frequencies so as to transpose the carrier ($p_0$) associated with said channel of interest as close as possible to zero frequency.

2. Apparatus according to claim 1, characterized in that said decimation means (41) are identical in all of the stages ($40_1$ to $40_L$).

3. Apparatus according to claim 1, characterized in that the decimation means (43) of each stage ($40_1$ to $40_L$) have a decimation factor equal to two.

4. Apparatus according to any one of claim 1, characterized in that said filter means (42) perform half-band lowpass filtering.

5. Apparatus according to claim 1, characterized in that the filter means (42) of a given stage perform half-band lowpass filtering with a transition zone that is at least as narrow as that of the half-band lowpass filtering performed by the filter means of the stage preceding said given stage.

6. Apparatus according to claim 1, characterized in that said transposition means (41) of each stage ($40_1$ to $40_L$) perform complex multiplication by a transposition coefficient: $C = e^{-j \cdot 2\pi \cdot f_t \cdot kT_e}$ $f_t$ being said transposition frequency of said stage as previously selected from a set of N possible distinct transposition frequencies so as to transpose the carrier associated with said channel of interest as close as possible to zero frequency; and $kT_e$ being the case sampling instant, k being an integer that increases with time, and $T_e = 1/f_e$ with $f_e$ being the sampling frequency of said stage.

7. Apparatus according to claim 6, characterized in that said transposition frequency $f_t$ of said stage is written: $f_t = (l \cdot f_e)/N$, where l is an integer lying in the range 0 to N−1.

8. Apparatus according to claim 6, characterized in that said transposition frequency $f_t$ of said stage is written: $f_t = (f_e/(2N)) \cdot (2l+1)$, where l is an integer lying in the range 0 to N−1.

9. Apparatus according to any one of claim 1, characterized in that at least two successive stages (FIG. 4, $40_1$ to $40_L$) including the first stage, are identical, with only said transposition frequency being specific to each stage, and in that said at least two successive identical stages are implemented using a single hardware cell whose transposition, filter, and decimation means are shared by said at least two successive identical stages.

10. Apparatus accordion to any one of claim 1, characterized in that the fineness of the transposition performed by the transposition means (41) of a given stage (FIG. 6, $40_i$) is greater than or equal to the fineness of the transposition performed by the transposition means (41) of the stage (FIG. 6, $40_{i-1}$) preceding said given stage.

11. Apparatus according to claim 1, characterized in that as a function of the initial and final oversampling factors of said channel of interest, respectively at the input to and at the output from said apparatus, said frequency multiplex of channels is applied directly to an appropriate stage situated downstream from the first stage.

12. A method of filtering, decimating and transposing into baseband, the method being of the entirely digital type and enabling both a particular channel referred to as the "channel of interest" in a frequency multiplex of channels to be extracted and transposed into baseband, and also the oversampling factor of said channel of interest to be reduced, each channel being associated with a distinct carrier, the method being characterized in that the operations of filtering, decimation, and transposition into baseband are performed in at least two successive processing stages ($80_1$ to $80_L$) where each processing stage comprises the following successive steps:

transposition (81) enabling the carrier associated with said channel of interest to be transposed as close as possible to zero frequency;

filtering (82); and decimation (83), said filtering step serving to purge a portion of the spectrum in locations where the decimation step produces aliasing.

13. A method according to claim 12, characterized in that it comprises a preliminary stage (70) of determining the number of successive processing stages and the transposition, filter, and decimation characteristics of each of said processing stages, the decimation factor of each stage being assumed to be known, the initial oversampling factor input to the first stage being assumed to be known, a maximum oversampling factor at the output from the last stage being imposed, said preliminary stage comprising the following steps:

with respect to the last processing stage: the optimum transposition characteristics (in terms of fineness of transposition) and filtering characteristics (in terms of difference from ideal filtering) are determined that enable said imposed maximum oversampling factor at the output from said last processing stage to be obtained;

with respect to the penultimate processing stage:

on the basis of the decimation factor of the last processing stage and on the basis of the maximum oversampling factor imposed at the output from the last processing stage, a maximum oversampling factor required at the output from said penultimate processing stage is calculated; and the optimum transposition characteristics and filter characteristics are determined enabling said maximum oversampling factor required at the output from said penultimate processing stage to be obtained;

the same reasoning is repeated until an earlier processing stage referred to as the "first" processing stage is obtained such that when said initial oversampling factor is applied thereto, then the oversampling factor at the output from said first processing stage is less than that previously calculated maximum required oversampling factor.

14. A method according to claim 13, characterized in that said preliminary stage (70) also comprises a final step consisting in:

for the last or the last X processing stages where $X \geq 1$: retaining the optimum transposition and filter characteristics specific to each processing stage; and for each of the L-X first processing stages, where L is the total number of processing stages and $L-X \geq 2$: replacing the optimum transposition of filter characteristics specific to each processing stage with common transposition of filter characteristics equal to those of the L-Xth processing stage.

15. A digital demodulator of the type comprising at least one single channel demodulation system (4) characterized in that each system (4) includes apparatus (6) according to claim 1 for filtering, decimating, and transposing into baseband.

* * * * *